United States Patent [19]
Koshikawa

[11] Patent Number: 6,104,224
[45] Date of Patent: Aug. 15, 2000

[54] DELAY CIRCUIT DEVICE HAVING A REDUCED CURRENT CONSUMPTION

[75] Inventor: Yasuji Koshikawa, Tokyo, Japan

[73] Assignee: NEC Corporation, Tokyo, Japan

[21] Appl. No.: 09/075,531

[22] Filed: May 11, 1998

[30] Foreign Application Priority Data

May 9, 1997 [JP] Japan ................................. 9-135986

[51] Int. Cl.$^7$ ................................................. H03H 11/26
[52] U.S. Cl. ........................... 327/277; 327/271; 327/293
[58] Field of Search .................................... 327/277, 261,
327/269, 271, 141, 161, 291, 293, 295,
296, 407

[56] References Cited

U.S. PATENT DOCUMENTS

| | | | |
|---|---|---|---|
| 5,699,003 | 12/1997 | Saeki | 327/261 |
| 5,767,712 | 6/1998 | Takemae et al. | 327/152 |
| 5,909,133 | 6/1999 | Park | 327/277 |

FOREIGN PATENT DOCUMENTS

| | | |
|---|---|---|
| 0 720 291 | 7/1996 | European Pat. Off. . |
| 8-237091 | 9/1996 | Japan . |

Primary Examiner—Timothy P. Callahan
Assistant Examiner—Minh Nguyen
Attorney, Agent, or Firm—Foley & Lardner

[57] ABSTRACT

A delay circuit device having first and second delay circuits arrays so constructed that an output can be taken out from an arbitrary position of a signal transmission path, discriminating circuits receiving an output from two positions which divide the first delay circuit array into three portions, and three control circuits. The first and second delay circuit arrays are so arranged that the direction of signal transmission paths are opposite to each other. An output of the first delay circuit array is connected to an input of the second delay circuit array through the control circuits in the order from the position near to an input of the first delay circuit array and in the order from the position near to an output of the second delay circuit array. A first signal is supplied to the first delay circuit array, and whether or not the first signal is propagated to the output of the two positions is respectively latched in the discriminating circuits. When an arbitrary time has elapsed after the first signal is supplied, a second signal is supplied to not greater than four control circuits of the control circuits, in accordance with data latched in the discriminating circuits. The first signal on the first delay circuit array is transferred to the second delay circuit array, and the first signal on the first delay circuit array is removed. Thus, a clock having no phase difference from an external clock can be generated with a low current consumption, with a small number of periods, over a wide frequency range, and over a wide power supply voltage range.

8 Claims, 8 Drawing Sheets

DELAY CIRCUIT DEVICE HAVING A REDUCED CURRENT CONSUMPTION

BACKGROUND OF THE INVENTION

1. Field of the Invention

The present invention relates to a delay circuit device, and more specifically to a delay circuit used in transmission and generation of a synchronizing signal, namely, a clock signal in a semiconductor device.

2. Description of Related Art

Recently, a system installed on a semiconductor device has been remarkably speeded up, with the result that a time difference between a clock supplied to the semiconductor device from an external device and a clock generated internally in the semiconductor device on the basis of the externally supplied clock becomes non-negligible. As a countermeasure for this, for example, a phase locked loop (called a "PLL" hereinafter) has been used in the prior art. FIG. 6 illustrate a fundamental construction of the PLL circuit.

A phase comparator 601 outputs a phase difference signal 606 based on a phase difference between an external clock 603 supplied through a receiver circuit 602 and an internal clock 605 supplied through a delay circuit 604 having a delay equivalent to that of the receiver circuit 602. The phase difference signal 606 is supplied through a loop filter 607 as a control signal 608 to a voltage controlled oscillator (VCO) 609. This voltage controlled oscillator 609 generates a clock 610 having the frequency in accordance with the control signal 608. The clock signal 610 is amplified by an amplifier circuit 611 to become the internal clock 605 which is used in a clock-controlled circuit 612. The control signal 608 controls the voltage controlled oscillator 609 to make the phase difference between the external clock 603 and the internal clock 605 zero, and controls the voltage controlled oscillator 609 until the phase difference can no longer be detected finally.

Therefore, in the PLL circuit, a delay between the external clock and the internal clock becomes zero, with the result that it is possible to avoid a problem that a delay time becomes relatively large in comparison with the period of the clock and therefore a trouble occurs in a circuit operation.

As a means for solving the problem of a circuit using the PLL circuit, Japanese Patent Application No. 316875/1994 (Japanese Patent Application Pre-examination Publication No. JP-A-08-237091) proposes a delay circuit device as shown in FIG. 7.

Referring to FIG. 7, it comprises a delay circuit array 701 so constructed that an output can be taken out from an arbitrary position of a signal transmission path, a delay circuit array 702 so constructed that an input can be applied to an arbitrary position of a signal transmission path, a control circuit 703 having a signal input terminal and a signal output terminal, a load adjusting device 704 for equalizing a load of the delay circuit array 701 and a load of the delay circuit array 702, a receiver circuit 705 receiving an external signal, an amplifier circuit 706, a delay circuit 707 having a delay time equivalent to that of the receiver circuit 705, and a delay circuit 708 having a delay time equivalent to that of the amplifier circuit 706.

An output of the receiver circuit 705 is connected to an input of the delay circuit 707 and the control circuit 703. An output of the delay circuit 707 is connected to an input of the delay circuit 708. An output of the delay circuit 708 is connected to an input of tile delay circuit array 701. An output of the delay circuit array 702 is connected to an input of the amplifier circuit 706. The delay circuits 707 and 708 have the delay times equivalent to those of the receiver circuit 705 and the amplifier circuit 706, respectively, in order to make an input clock 801 and an output timing of an output clock 805 coincident with each other.

Here, internal structures of the delay circuit array 701, the delay circuit array 702, the control circuit 703 and the load adjusting device 704 will be described. The delay circuit array 701 and the delay circuit array 702 are constructed of inverters and NAND gates which are alternately located, and the control circuit 703 and the load adjusting device 704 are constructed of NAND gates.

The delay circuit 701 includes a NAND gate FN1, an inverter FI1, a NAND gate FN2, an inverter FI2, . . . , a NAND gate FNn, an inverter FIn, a NAND gate FNn+1, an inverter FIn+1, . . . , which are located in the named order from an input side.

The delay circuit 702 includes an inverter RI1, a NAND gate RN1, an inverter RI2, a NAND gate RN2, . . . , an inverter RIn, a NAND gate RNn, an inverter RIn+1, a NAND gate RNn+1, . . . , which are located in the named order from an output side.

The control circuit 703 is constituted of a NAND circuit array composed of a NAND gate CN1, a NAND gate CN2, . . . , a NAND gate CNn, a NAND gate CNn+1, which have one input connected to the output of the receiver circuit 705.

The load adjusting device 704 is constituted of a NAND circuit array composed of a NAND gate GN1, a NAND gate GN2, . . . , a NAND gate GNn, a NAND gate GNn+1, which have one input connected to a ground line 710.

In addition, the delay circuit array 701, the delay circuit array 702, the control circuit 703 and the load adjusting device 704 are mutually connected. An output of the inverter Fin in the delay circuit array 701 is connected to an input of the NAND gate FNn+1 and one input of the two-input NAND gate CNn, in the control circuit 703, which is not connected to the output of the receiver circuit 705.

An output of the NAND gate CNn in the control circuit 703 is connected to one input of the two-input NAND gate FNn+2, in the delay circuit array 701, which is not connected to the output of the inverter FIn+1, and one input of the two-input NAND gate RNn, in the delay circuit array 702, which is not connected to the output of the inverter RIn+1.

An output of the NAND gate RNn in the delay circuit array 702 is connected to an input of the inverter RIn in the delay circuit array 702. An output of the inverter RIn in the delay circuit array 702 is connected to an input of the NAND gate RNn-I and one input of the two-input NAND gate GNn, in the load adjusting device 704, which is not connected to the ground.

An output of the NAND gate GNn in the load adjusting device 704 is not connected to any one.

One input of the two-input NAND gate FN1, in the delay circuit array 701, which is not connected to an input of the delay circuit array 701, one input of the two-input NAND gate FN2 which is not connected to an output of the inverter FI1, and one input of the last NAND gate in the delay circuit array 702, which is not connected to an output of the last NAND gate in the control circuit 703, are connected to a power supply line 709.

Now, an operation of this delay circuit is illustrated in an input/output timing waveform diagram of FIG. 8.

The input clock 801 is a H (high level) pulse having a constant period, a rising edge of which is used.

A clock group 802 indicates clocks which are outputted from all the inverters in the delay circuit array 701 and which therefore travel in the delay circuit array 701.

A clock 803 is a clock outputted from the receiver circuit 705 and inputted to the control circuit 703.

The receiver circuit 705 internally includes a circuit for making the width of the clock pulse to a constant width, so that the width of the clock 803 is made smaller than the width of the clock 801.

A clock group 804 indicates clocks which are outputted from all the inverters in the delay circuit array 702 and which therefore travel in the delay circuit array 702.

A clock 805 is an output of the amplifier circuit 806.

Since the clock is applied periodically, it is not necessary to distinguish the clocks from each other in an actual use, Here, however, in order to make it easy to understand the operation, the clocks are numbered as follows:

an arbitrary clock is called a (m)th clock;

a next clock is called a (m+1)th clock; and a clock after the next clock is called a (m+2)th clock.

The (m)th clock is supplied from the receiver Circuit 705 through the delay circuit 707 having the delay time equivalent to that of the receiver circuit 705, and then through the delay circuit 708 having the delay time equivalent to that of the amplifier circuit 706, to the delay circuit array 701, and travels in the delay circuit array 701 and expressed by the (m)th clock group in the clock group 802.

The output of the inverters in the delay circuit array 701 is brought to the high level in response to the traveling of the (m)th clock, and is maintained at a high level during a period of the pulse width of the (m)th clock.

After one clock period after the (m)th clock is outputted from the receiver circuit 705, the (m+1)th clock is supplied from the receiver circuit 705 to the control circuit 703, and is expressed as the (m+1)th clock of the clock 803.

At this time, the (m)th clock is traveling in the delay circuit array 701. For example, assuming that the (m)th clock is traveling through an inverter group starting from a (j)th inverter FIj (an inverter positioned at a leading edge of the high level pulse) in the delay circuit array 701 and terminating at a (j–k)th inverter FIj–k (an inverter positioned at a tail edge of the high level pulse), with the width of the (m)th clock, the outputs of the (j)th inverter FIj to the (j–k)th inverter are at the high level as mentioned above.

Accordingly, the NAND gates CNj to CNj–k in the control circuit 703 connected to the inverters FIj to FIj–k through which the (m)th clock is traveling, have both the two inputs at the high level. Therefore, in the two-input NAND gates RNj to RNj–k in the delay circuit array 702 connected to the NAND gates CNj to CNj–k in the control circuit 703, one of the two inputs is brought to the low level, and therefore, the output is brought from the high level to the low level, so that the (m)th clock is traveling the delay circuit array 702 in the form of a low level pulse, which is indicated by the (m)th clock group in the clock group 804.

Furthermore, the input of the two-input NAND gates FNj+2 to FNj–k+2 in the delay circuit array 701, connected to the NAND gates CNj to CNj–k in the control circuit 703, is brought to the low level, with the result that the output of all of the inverters FIj+2 to FIj–k+2 are brought to the low level, and the (m)th clock in the delay circuit array 701 is brought to the low level.

The (m)th clock outputted from the delay circuit array 702 is outputted through the amplifier circuit 706, and is expressed as the (m)th clock in the clock 805.

Here, the respective delay times of the receiver circuit 705 and the delay circuit 707, which are equal to each other as mentioned above, is expressed as "d1", and the respective delay times of the amplifier circuit 706 and the delay circuit 708, which are equal to each other as mentioned above, is expressed as !"d2". In addition, the period of the clock is expressed as "tck". A delay from the rising edge of the (m)th clock of the input clock 801 to the rising edge of the (m)th clock of the output clock 803 of the receiver circuit 705 is "d1".

A delay from the (m)th clock of the output clock 803 of the receiver circuit 705 to the rising edge of a heading clock of the (m)th clock group in the clock group 802 traveling in the delay circuit array 701, is equal to the delay from the (m)th clock of the output clock 803 of the receiver circuit 705 to the (m+1)th clock of the output clock 803 of the receiver circuit 705, and is "tck".

Accordingly, the time of the clock rising edge traveling in the delay circuit array 701 is equal to a time obtained by subtracting the delay time "d1" of the delay circuit 707 and the delay time "d2" of the delay circuit 708 from the clock period "tck", namely, {tck–d1–d2}.

Since the number of the delay circuit stages through which the rising edge of the low level pulse of the clock travels in the delay circuit array 702 is equal to the number of the delay circuit stages through which the rising edge of the clock traveled in the delay circuit array 701, the time in which the rising edge of the low level pulse of the clock travels in the delay circuit array 702 is equal to the time in which the rising edge of the clock travels in the delay circuit array 701, and therefore, is equal to a time obtained by subtracting the delay time "dl" of the delay circuit 707 and the delay time "d2" of the delay circuit 708 from the clock period "tck", namely, {tck–d1–d2}.

The time required for the clock to have passed through the amplifier circuit 706 is "d2" as mentioned above.

Thus, the time required for the clock to have passed through the receiver circuit 705, the delay circuit 707, the delay circuit 708, the delay circuit array 701, the delay circuit array 702, and the amplifier circuit 706, becomes "2tck", and therefore, the (m)th clock is outputted to the internal circuit 712 at the timing equal to that of the (m+2)th clock.

As mentioned above, an internal clock having no delay from the external clock can be obtained after two clocks.

When the prior art delay circuit device is used in the PLL circuit, a time (several ten periods or more) is required until the phase difference between the internal clock and the external clock becomes zero, and therefore, in order to obtain at a desired timing an internal clock having no phase difference from the external clock, it is necessary to maintain the PLL circuit in an operating condition, with the result that a current consumption is increased.

In addition, since the voltage controlled oscillator is so configured to control the oscillation by the voltage, if the power supply voltage lowers, the width of the control voltage correspondingly becomes small, with the result that the precision of the controlled frequency drops.

Therefore, in the case of controlling the frequency over a wide frequency range with a predetermined precision of the controlled frequency, it is a problem that it is necessary to provide a plurality of voltage controlled oscillators having different frequency ranges and a time is required until the phase difference becomes zero when the control voltage is changed.

The prior art delay circuit device shown in FIG. 7 was intended to overcome the above mentioned problems when it is used in the PLL circuit. Since the clock 803 outputted from the receiver circuit 705 is supplied to many NAND gates in the control circuit 703, it was a problem that a load capacitance to be driven is large, and the current consumption is large.

Namely, in order to ensure the operation when the clock period "tck" is long, it is necessary to increase the number of stages in the delay circuit 701, with the result that the load capacitance of the clock 802 correspondingly increases.

SUMMARY OF THE INVENTION

Accordingly, it is an object of the present invention to provide a delay circuit device which has overcome the above mentioned problems of the prior art.

Another object of the present invention is to provide a delay circuit device capable of generating a clock signal having no phase difference from an external clock, with a small current, with a small number of periods, over a wide frequency range, and over a wide power supply voltage range.

In order to achieve the above objects, the delay circuit device in accordance with the present invention comprises a first delay circuit array so constructed that an output can be taken out from an arbitrary position of a signal transmission path, a second delay circuit array so constructed that an input can be applied to an arbitrary position of a signal transmission path, at least two discriminating circuits receiving an output from at least two positions which divide the first delay circuit array into at least three, and at least three control circuits having a signal input terminal, a signal output terminal, and an input/output control terminal. The first delay circuit array and the second delay circuit array are so arranged that the direction of signal transmission paths are opposite to each other. An output of the first delay circuit array is connected to an input of the second delay circuit array through the control circuits in the order from the position near to an input of the first delay circuit array and in the order from the position near to an output of the second delay circuit array. A first signal is supplied to the first delay circuit array, and information as to whether or not the first signal is propagated to the output of the at least two positions which divide the first delay circuit array into the at least three, is respectively latched to the latch circuits receiving the output of the at least two positions. When an arbitrary time has elapsed after the first signal is supplied, a second signal is supplied to not greater than four control circuits of the control circuits, in accordance with data latched in the discriminating circuits. The first signal on the first delay circuit array is transferred to the second delay circuit array, and the first signal on the first delay circuit array is removed from the first delay circuit array.

DESCRIPTION OF THE PREFERRED EMBODIMENTS

Now, embodiments of the delay circuit device in accordance with the present invention will be described with reference to the accompanying drawings.

Figure 1:
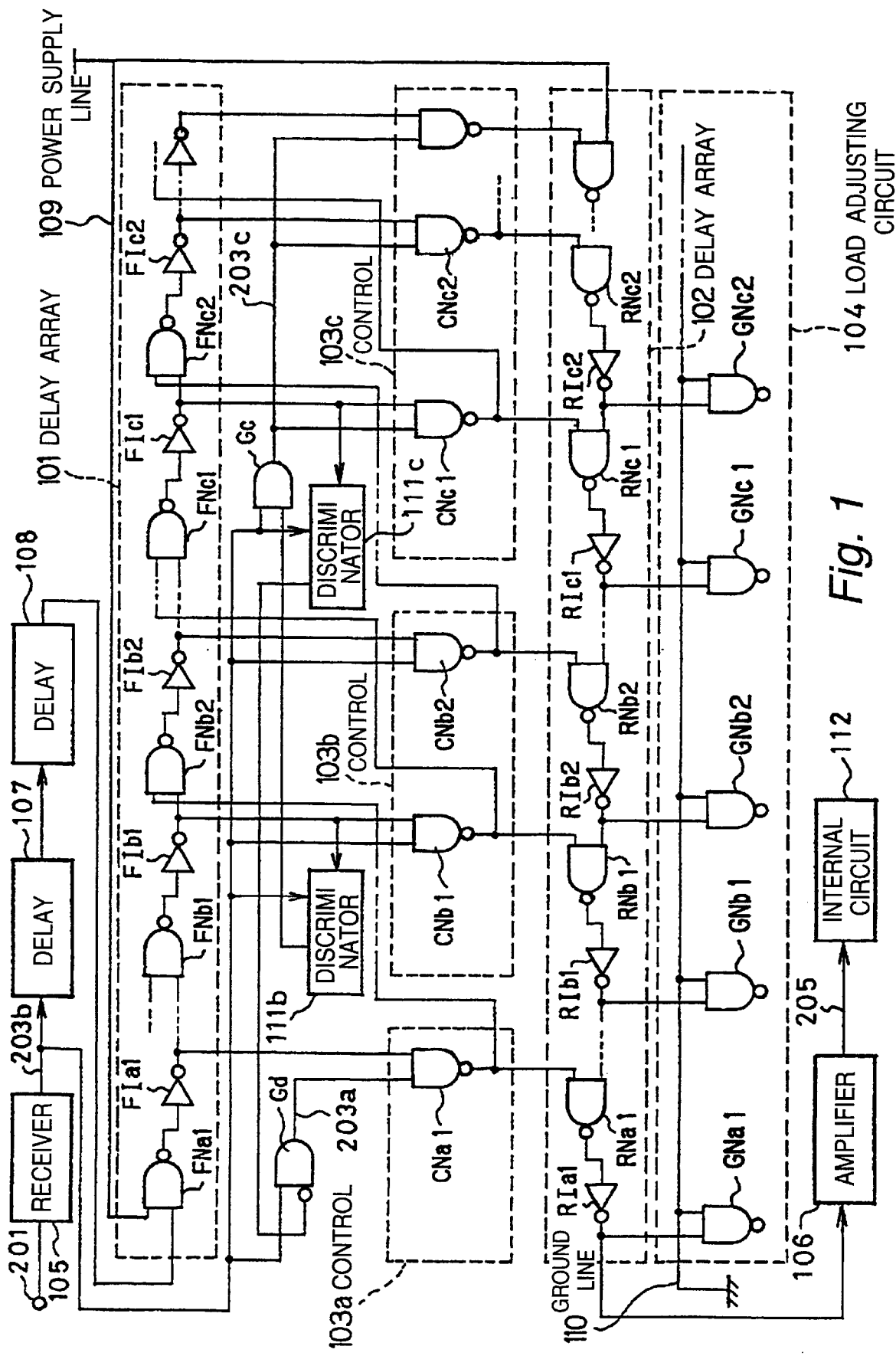
FIG. 1 is a circuit diagram illustrating a circuit construction of one embodiment of the delay circuit device in accordance with the present invention.

FIG. 1 is a circuit diagram illustrating a circuit construction of one embodiment of the delay circuit device in accordance with the present invention.

Referring to FIG. 1, the shown embodiment includes a delay circuit array 101 so constructed that an output can be taken out from an arbitrary position of a signal transmission path, a delay circuit array 102 so constructed that an input can be applied to an arbitrary position of a signal transmission path, a plurality of control circuits 103a, 103b and 103c having a signal input terminal and a signal output terminal, a load adjusting device 104 for equalizing a load of the delay circuit array 101 and a load of the delay circuit array 102, a receiver circuit 105 receiving an external signal, an amplifier circuit 106, a delay circuit 107 having a delay time equivalent to that of the receiver circuit 105, a delay circuit 108 having a delay time equivalent to that of the amplifier circuit 106, a plurality of comparing circuits 111b and 111c, and logic gates Ga and Gc.

Now, circuit connection will be described. An output of the receiver circuit 105 is connected to an input of the delay circuit 107, the control circuit 103b, and the comparing circuits 111b and 111c.

An output of the delay circuit 107 is connected to an input of the delay circuit 108. An output of the delay circuit 108 is connected to an input of the delay circuit array 101. An output of the delay circuit array 102 is connected to an input of the amplifier circuit 106.

The delay circuits 107 and 108 have a delay time equivalent to that of the receiver circuit 105 and the amplifier circuit 106, respectively, in order to make an input clock 201 and an outputting timing of an output clock 205 coincident with each other.

Now, an internal construction of the delay circuit array 101, the delay circuit array 102, the control circuits 103a, 103b and 103c and the load adjusting device 104 will be described with reference to FIG. 1.

The delay circuit array 101 and the delay circuit array 102 are constructed of inverters and NAND gates which are alternately located, and the control circuits 103a, 103b and 103c and the load adjusting device 104 are constructed of NAND gates.

The delay circuit 101 includes a NAND gate FNa1, an inverter FIa1, a NAND gate FNa2, an inverter FIa2, ..., a NAND gate FNb1, an inverter FIb1, a NAND gate FNb2, an inverter FIb2, ..., a NAND gate FNc1, an inverter FIc1, a NAND gate FNc2, an inverter FIc2, ..., which are located in the named order from an input side (some portion is not shown).

The delay circuit 102 includes an inverter RIa1, a NAND gate RNa1, an inverter RIa2, a NAND gate RNa2, ..., an inverter RIb1, a NAND gate RNb1, an inverter RIb2, a NAND gate RNb2, ..., an inverter RIc1, a NAND gate RNc1, an inverter RIc2, a NAND gate RNc2, ..., which are located in the named order from an output side.

The control circuit 103a is constituted of a NAND circuit array composed of a NAND gate CNa1, a NAND gate CNa2, . . . , which have one input connected to an output of the logic gate Ga.

The control circuit 103b is constituted of a NAND circuit array composed of a NAND gate CNb1, a NAND gate CNb2, . . . , which have one input connected to an output of the receiver circuit 105.

The control circuit 103c is constituted of a NAND circuit array composed of a NAND gate CNc1, a NAND gate CNc2, . . . , which have one input connected to an output of the logic gate Gc.

The load adjusting device 104 is constituted of a NAND circuit array composed of a NAND gate GNa1, a NAND gate GNa2, . . . , a NAND gate GNb1, a NAND gate GNb2, . . . , a NAND gate GNc1, a NAND gate GNc2, . . . , which have one input connected to a ground line 110.

Next, a mutual connection of the delay circuit array 101, the delay circuit array 102, the control circuits 103a, 103b and 103c, the discriminator circuits 111b and 111c, the logic gates Ga and Gc, and the load adjusting circuit 104 will be described under the assumption of "n"=a1, a2, . . . , b1, b2, . . . , c1, c2, . . . . An output of the inverter FIn in the delay circuit array 101 is connected to the NAND gate FNn+1 and one input of the two-input NAND gate CNn in the control circuit 103a having the other input connected to the output of the logic gate Ga, the input of the control circuit 103b which is not connected to the output of the receiver circuit 105, or the input of the control circuit 103c which is not connected to the output of the logic gate Gc.

An output of the NAND gate CNn in the control circuits 103a, 103b and 103c is connected to one input of the two-input NAND gate FNn+2 in the delay circuit array 101 having the other input connected to the output of the inverter FIn+1, and to one input of the two-input NAND gate RNn in the delay circuit array 102 having the other input connected to the output of the inverter RIn+1.

An output of the NAND gate RNn in the delay circuit array 102 is connected to an input of the inverter RIn in the delay circuit array 102.

An output of the inverter RIn in the delay circuit array 102 is connected to the input of the NAND gate RNn-1 and one input of the two-input NAND gate GNn in the load adjusting circuit 104 having the other input connected to the ground. An output of NAND gate GNn in the load adjusting circuit 104 is not connected to any one.

The input of the two-input NAND gate FN1 in the delay circuit array 101 which is not connected to the input terminal of the delay circuit array 101, the input of the two-input NAND gate FN2 which is not connected to the output of the inverter FI1, and the input of the last two-input NAND gate in the delay circuit array 102 which is not connected to the output of the last NAND gate in the control circuit 103, are connected to a power supply line 109.

Furthermore, the discriminator circuit 111b receives the output of the inverter FIb1 and the output of the receiver circuit 105, and the discriminator circuit 111c receives the output of the inverter FIc1 and the output of the receiver circuit 105. The logic gate Ga receives an output of the discriminator circuit 111c and the output of the receiver circuit 105, and the logic gate Gc receives an output of the discriminator circuit 111b and the output of the receiver circuit 105.

For example, the discriminator circuits 111b and 111c are constituted of a D-type flipflop receiving the output from the delay circuit array 101 and outputting an output signal in synchronism with the output of the receiver circuit 105. The logic gate Ga is formed to execute a logical AND operation between a logical inversion of the output of the discriminator circuit 111c and the output of the receiver circuit 105, and the logic gate Gc is formed to execute a logical AND operation between a logical inversion of the output of the discriminator circuit 111b and the output of the receiver circuit 105.

Figure 2:
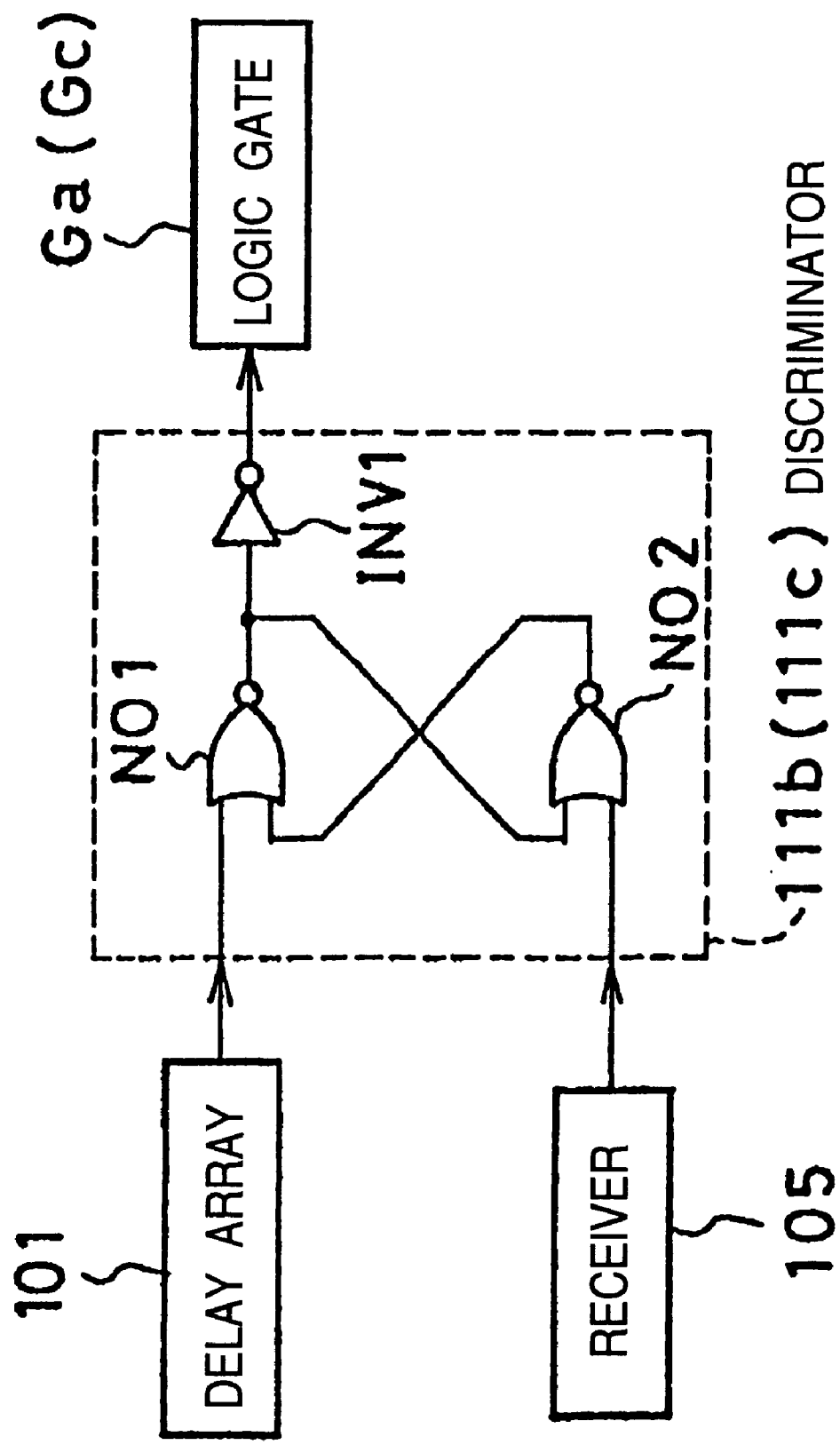
FIG. 2 is a circuit diagram of the discriminator circuit incorporated in the delay circuit device shown in FIG. 1.

As another example, as shown in FIG. 2, the discriminator circuits 111b and 111c can be constituted of a RS flipflop composed of a NOR gate NO1 receiving the output from the delay circuit array 101 and another NOR gate NO2 receiving the output of the receiver circuit 105, and an inverter INV1 receiving an output of the NOR gate NO1 for outputting an output signal to the logic gate Ga or Gc.

Figure 3:
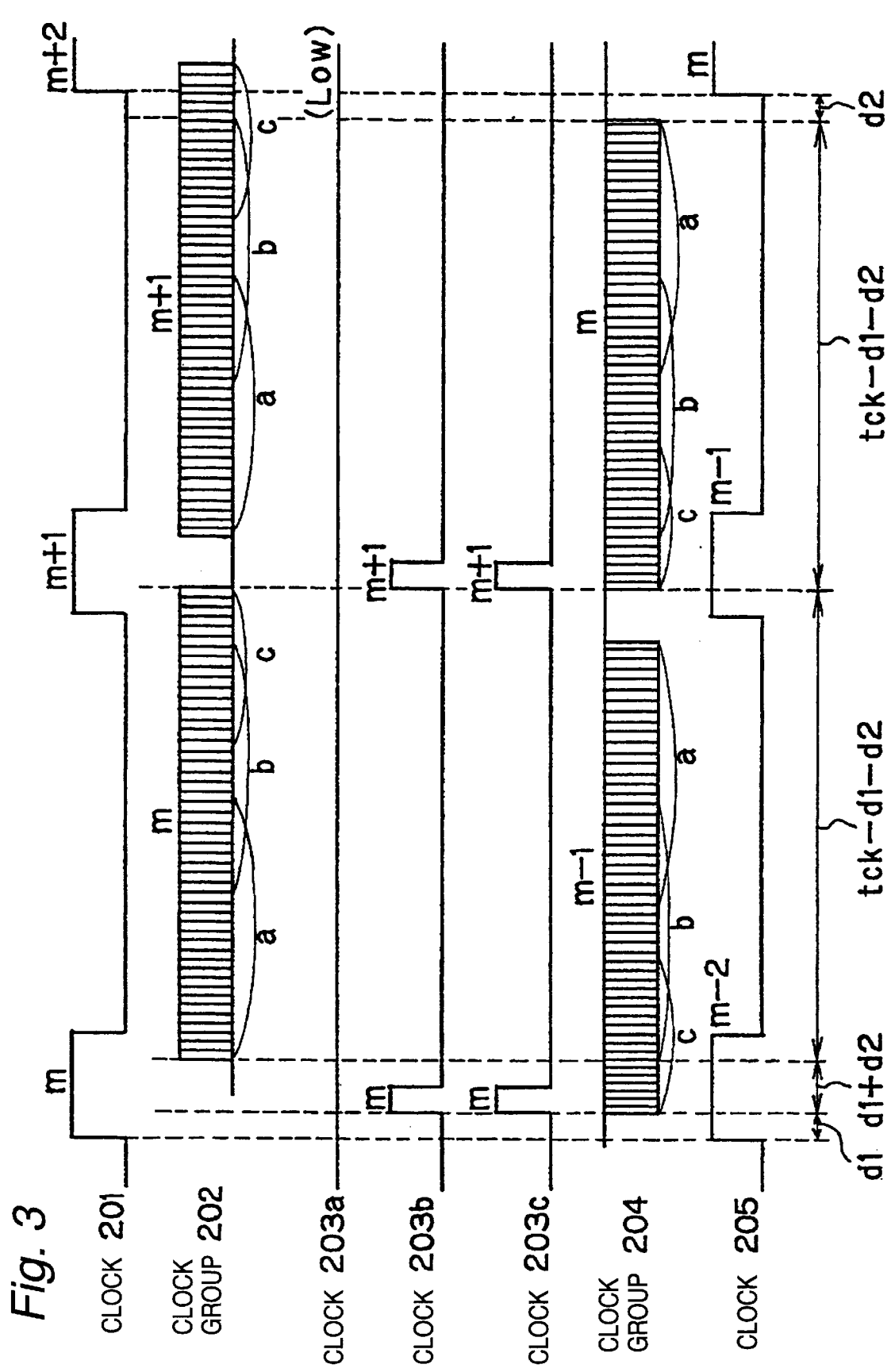
FIG. 3 is a waveform diagram illustrating one example of the operation of the delay circuit device shown in FIG. 1.

FIG. 3 is a waveform diagram illustrating an operation of this embodiment.

Referring to FIG. 3, the input clock 201 is a H (high level) pulse having a constant period, a rising edge of which is used.

A clock group 202 indicates clocks which are outputted from all the inverters in the delay circuit array 101 and which therefore travel in the delay circuit array 101. In FIG. 3, the pulses from the inverter FIa1 to the inverter before the inverter FIb1 exist in the range designated by "a", and the pulses from the inverter FIb1 to the inverter before the inverter FIc1 exist in the range designated by "b". The pulses from the inverter FIc1 to the last inverter exist in the range designated by "c".

A clock 203a is a clock outputted from the logic gate Ga and inputted to the control circuit 103a.

A clock 203b is a clock outputted from the receiver circuit 105 and inputted to the control circuit 103b.

A clock 203c is a clock outputted from the logic gate Gc and inputted to the control circuit 103c.

The receiver circuit 105 internally includes a circuit for making the width of the clock pulse to a constant width, so that the width of the clock 203b is made smaller than the width of the clock 201.

A clock group 204 indicates clocks which are outputted from all the inverters in the delay circuit array 102 and which therefore travel in the delay circuit array 102. In FIG. 3, the pulses until the inverter FIc1 exist in the range designated by "c", and the pulses from the inverter FIb1 to the inverter before the inverter FIc1 exist in the range designated by "b". The pulses from the inverter FIa1 to the last inverter exist in the range designated by "a".

A clock 205 is an output of the amplifier circuit 206.

Since the clock is applied periodically, it is not necessary to distinguish the clocks from each other in an actual use. Here, however, in order to make it easy to understand the operation, the clocks are numbered as follows:

an arbitrary clock is called a (m)th clock;

a next clock is called a (m+1)th clock; and a clock after the next clock is called a (m+2)th clock.

The (m)th clock is supplied from the receiver circuit 105 through the delay circuit 107 having the delay time equivalent to that of the receiver circuit 105, and then through the delay circuit 108 having the delay time equivalent to that of the amplifier circuit 106, to the delay circuit array 101, and travels in the delay circuit array 101 and expressed by the (m)th clock group in the clock group 202.

The output of the inverters in the delay circuit array 101 is brought to the high level in response to the traveling of the (m)th clock, and is maintained at a high level during a period of the pulse width of the (m)th clock. After one clock period after the (m)th clock is outputted from the receiver circuit 105, the (m+1)th clock is supplied from the receiver circuit 105 to the control circuit 103, and is expressed as the (m+1)th clock of the clock 203b.

In addition, if the output of the discriminator circuit 111c is at the low level, the (m+1)th clock is outputted from the logic gate Ga receiving the clock from the receiver circuit 105, and is supplied to the control circuit 103a. If the output of the discriminator circuit 111a is at the high level, the (m+1)th clock is outputted from the logic gate Gc receiving the clock from the receiver circuit 105, and is supplied to the control circuit 103c.

At this time, the (m)th clock is traveling in the delay circuit array 101. For example, assuming that the (m)th clock is traveling through an inverter group starting from a (j)th inverter FIj (an inverter positioned at a leading edge of the high level pulse; J=a1, a2, ..., b1, b2, ..., c1, c2, ...) in the delay circuit array 101 and terminating at a (j-k)th inverter FIj-k (an inverter positioned at a tail edge of the high level pulse, with the width of the (m)th clock, the outputs of the (j)th inverter FIj to the (j-k)th inverter FIj-k are at the high level as mentioned above.

Accordingly, the NAND gates CNj to CNj-k in the control circuit 103 connected to the inverters FIj to FIj-k through which the (in)th clock is traveling, have both the two inputs at the high level. Therefore, in the two-input NAND gates RNj to RNj-k in the delay circuit array 102 connected to the NAND gates CNj to CNj-k in the control circuit 103, one of the two inputs is brought to the low level, and therefore, the output is brought from the high level to the low level, so that the (m)th clock is traveling the delay circuit array 102 in the form of a low level pulse, which is indicated by the (m)th clock group in the clock group 204.

Furthermore, the input of the two-input NAND gates FNj+2 to FNj-k+2 in the delay circuit array 101, connected to the NAND gates CNj to CNj-k in the control circuits 103a, 103b and 103c, is brought to the low level, with the result that the output of all of the inverters FIj+2 to FIj-k+2 are brought to the low level, and the (m)th clock in the delay circuit array 101 is brought to the low level.

The (m)th clock outputted from the delay circuit array 102 is outputted through the amplifier circuit 106, and is expressed as the (m)th clock in the clock 205.

Here, in the case shown in FIG. 3, after the (m)th clock reaches the inverter FIc1 in the delay circuit array 101, the (m+1)th clock is outputted from the receiver circuit 105. Therefore, the output of both the discriminator circuits 111b and 111c are latched at the high level, and since the output of the discriminator circuit 111c is at the high level, the clock 203a which is the output of the logic gate Ga is fixed to the low level.

Figure 4:
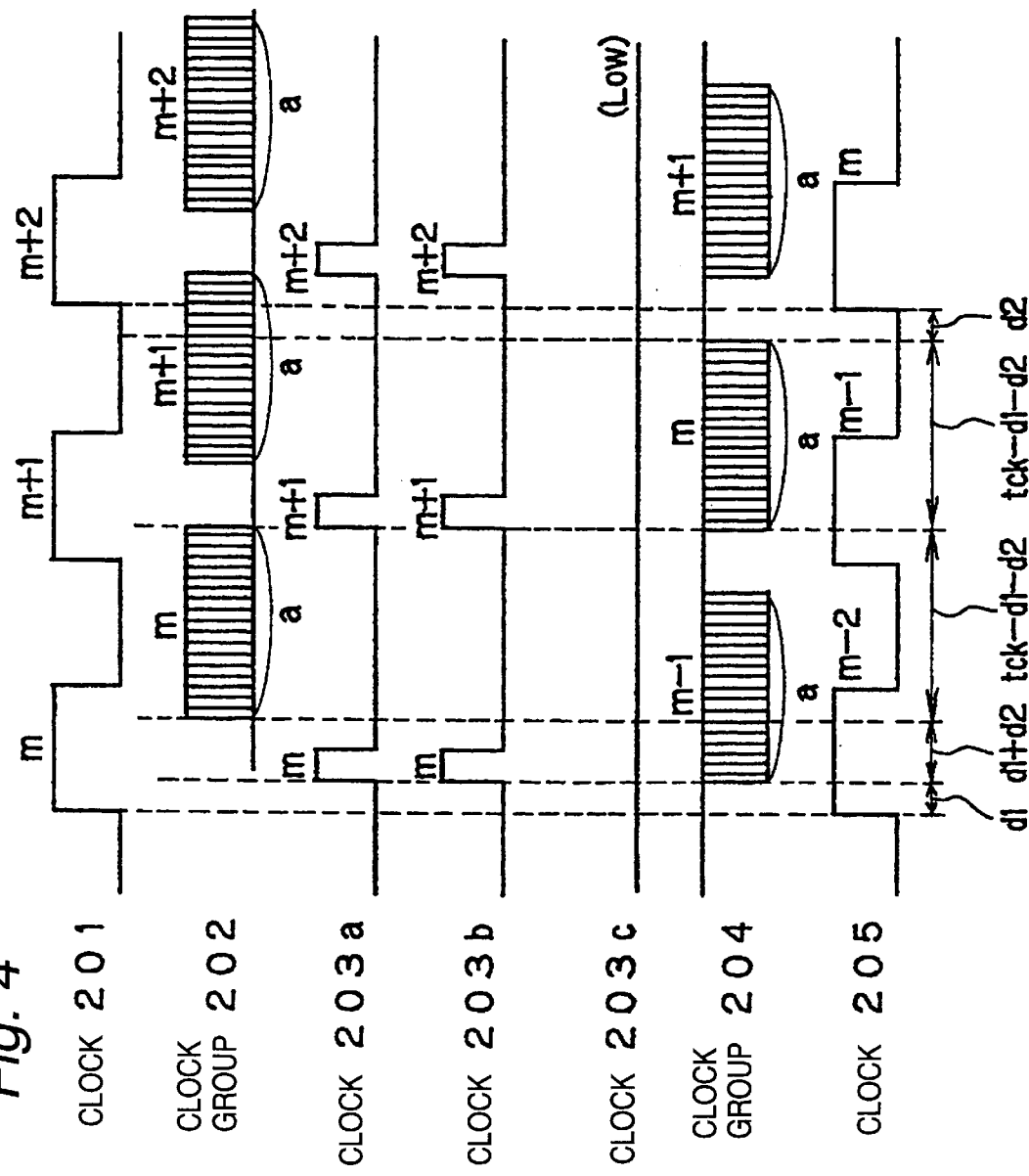
FIG. 4 is a waveform diagram illustrating another example of the operation of the delay circuit device shown in FIG. 1.

On the other hand, in the case shown in FIG. 4, before the (m)th clock reaches the inverter FIb1, the (m+1)th clock is outputted from the receiver circuit 105. Therefore, the output of both the discriminator circuits 111b and 111c are latched at the low level, and since the output of the discriminator circuit 111b is at the high level, the clock 203c which is the output of the logic gate Gc is fixed to the low level.

Furthermore, after the (m)th clock reaches the inverter FIb1, but before the (m)th clock reaches the inverter FIc1, if the (m+1)th clock is outputted from the receiver circuit 105, the output of the discriminator circuit 111b is latched at the high level, and the output of the discriminator circuit 111c is latched at the low level, so that the pulse is generated in all the clocks 203a, 203b and 203c.

Figure 8:
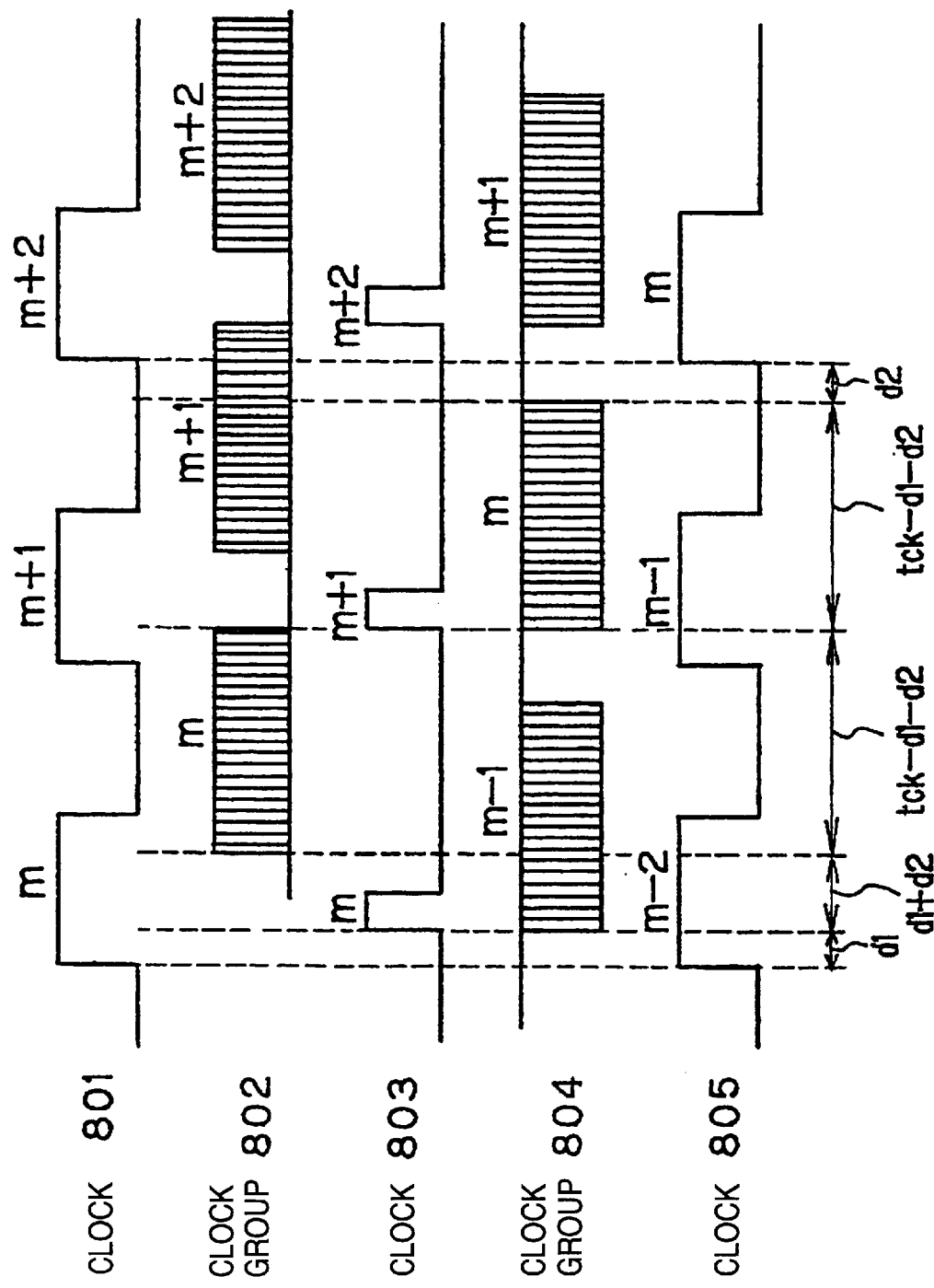
FIG. 8 is a waveform diagram illustrating an operation of the prior art delay circuit device shown in FIG. 7.

Similarly to the prior art delay circuit device having the timing waveform shown in FIG. 8, the respective delay times of the receiver circuit 105 and the delay circuit 107 are equal to each other as mentioned above and are expressed as "d1", and the respective delay times of the amplifier circuit 106 and the delay circuit 108 are equal to each other as mentioned above and are expressed as "d2". In addition, the period of the clock is expressed as "tck". A delay from the rising edge of the (m)th clock of the input clock 201 to the rising edge of the (m)th clock of the output clock 203 of the receiver circuit 105 is "d1".

A delay from the (m)th clock of the output clock 203 of the receiver circuit 105 to the rising edge of a heading clock of the (m)th clock group in the clock group 202 traveling in the delay circuit array 101, is equal to the delay from the rising edge of the (m)th clock of the output clock 203 of the receiver circuit 105 to the rising edge of the (m+1)th clock of the output clock 203 of the receiver circuit 105, and is "tck".

Accordingly, the time of the clock rising edge traveling in the delay circuit array 101 is equal to a time obtained by subtracting the delay time "d1" of the delay circuit 107 and the delay time "d2" of the delay circuit 108 from the clock period "tck", namely, {tck−d1−d2}.

Since the number of the delay circuit stages through which the rising edge of the low level pulse of the clock travels in the delay circuit array 102 is equal to the number of the delay circuit stages through which the rising edge of the clock traveled in the delay circuit array 101, the time in which the rising edge of the low level pulse of the clock travels in the delay circuit array 102 is equal to the time in which the rising edge of the clock travels in the delay circuit array 101, and therefore, is equal to a time obtained by subtracting the delay time "d1" of the delay circuit 107 and the delay time "d2" of the delay circuit 108 from the clock period "tck", namely, {tck−d1−d2}.

The time required for the clock to have passed through the amplifier circuit 106 is "d2" as mentioned above.

Thus, the time required for the clock to have passed through the receiver circuit 105, the delay circuit 107, the delay circuit 108, the delay circuit array 101, the delay circuit array 102, and the amplifier circuit 106, becomes "2tck", and therefore, the (m)th clock is outputted to the internal circuit 112 at the timing equal to that of the (m+2)th clock.

As mentioned above, an internal clock having no delay from the external clock can be obtained after two clocks.

Figure 5:
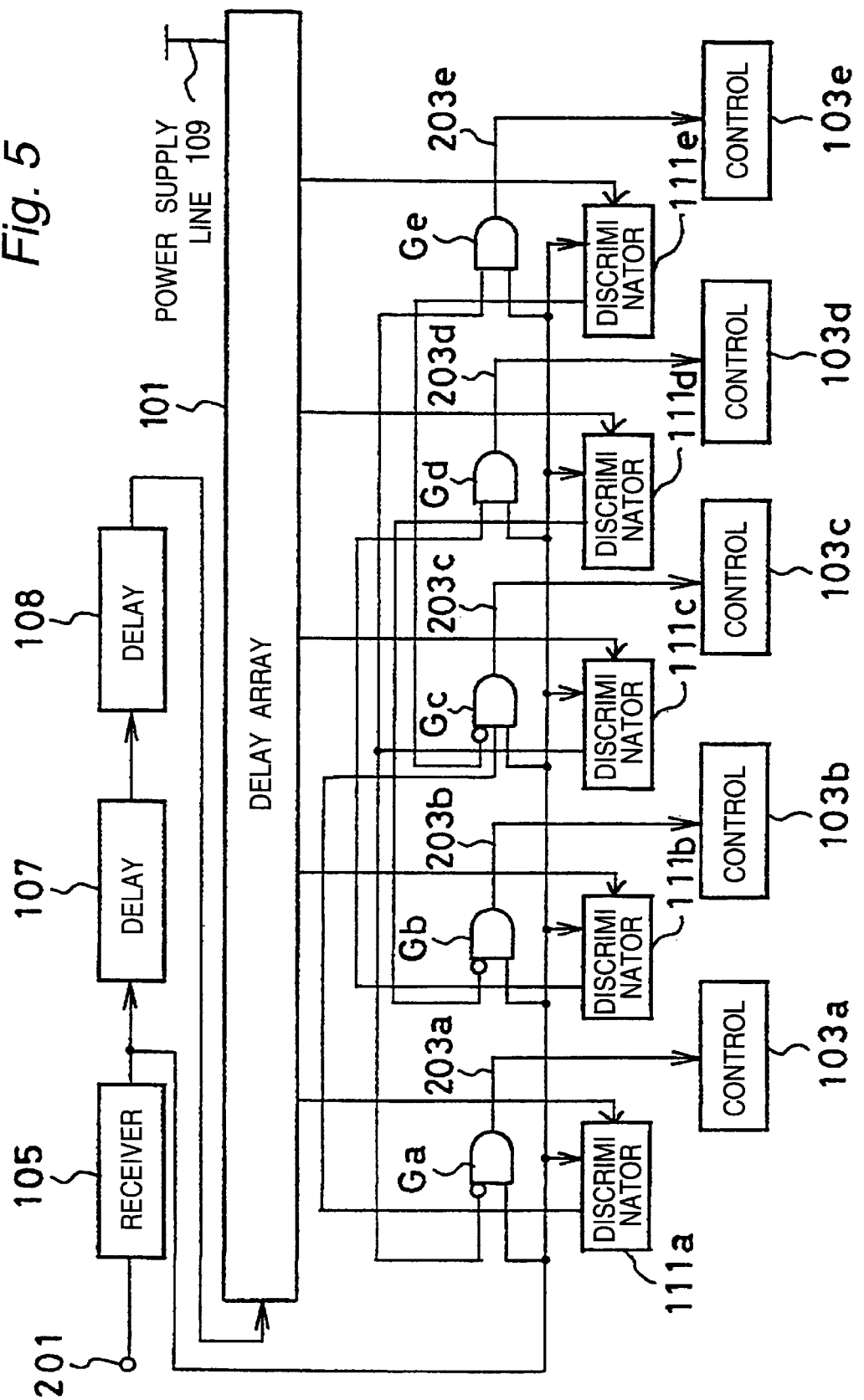
FIG. 5 is a circuit diagram illustrating a circuit construction of another embodiment of the delay circuit device in accordance with the present invention.
Figure 6:
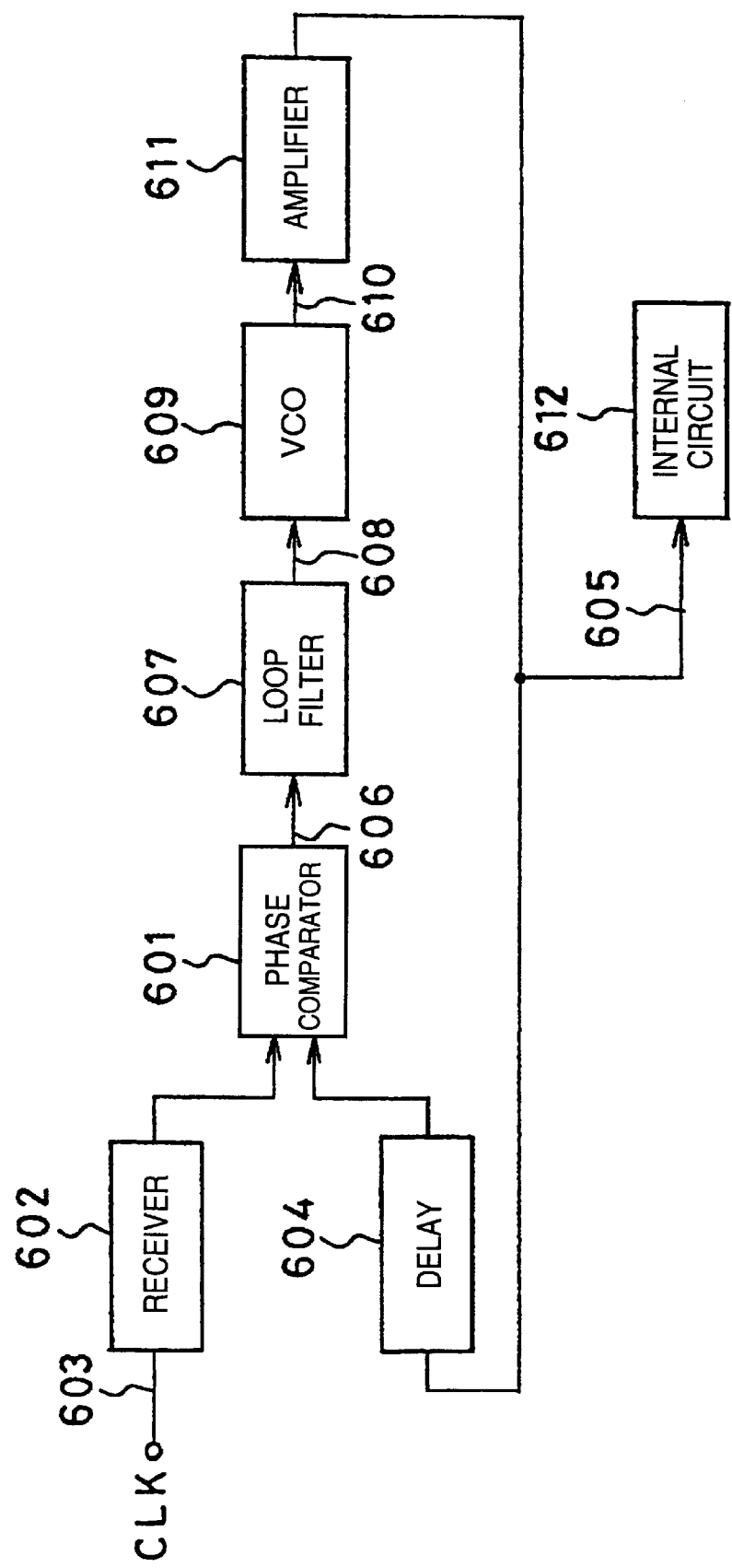
FIG. 6 is a circuit diagram illustrating the circuit construction of one example of the PLL circuit.
Figure 7:
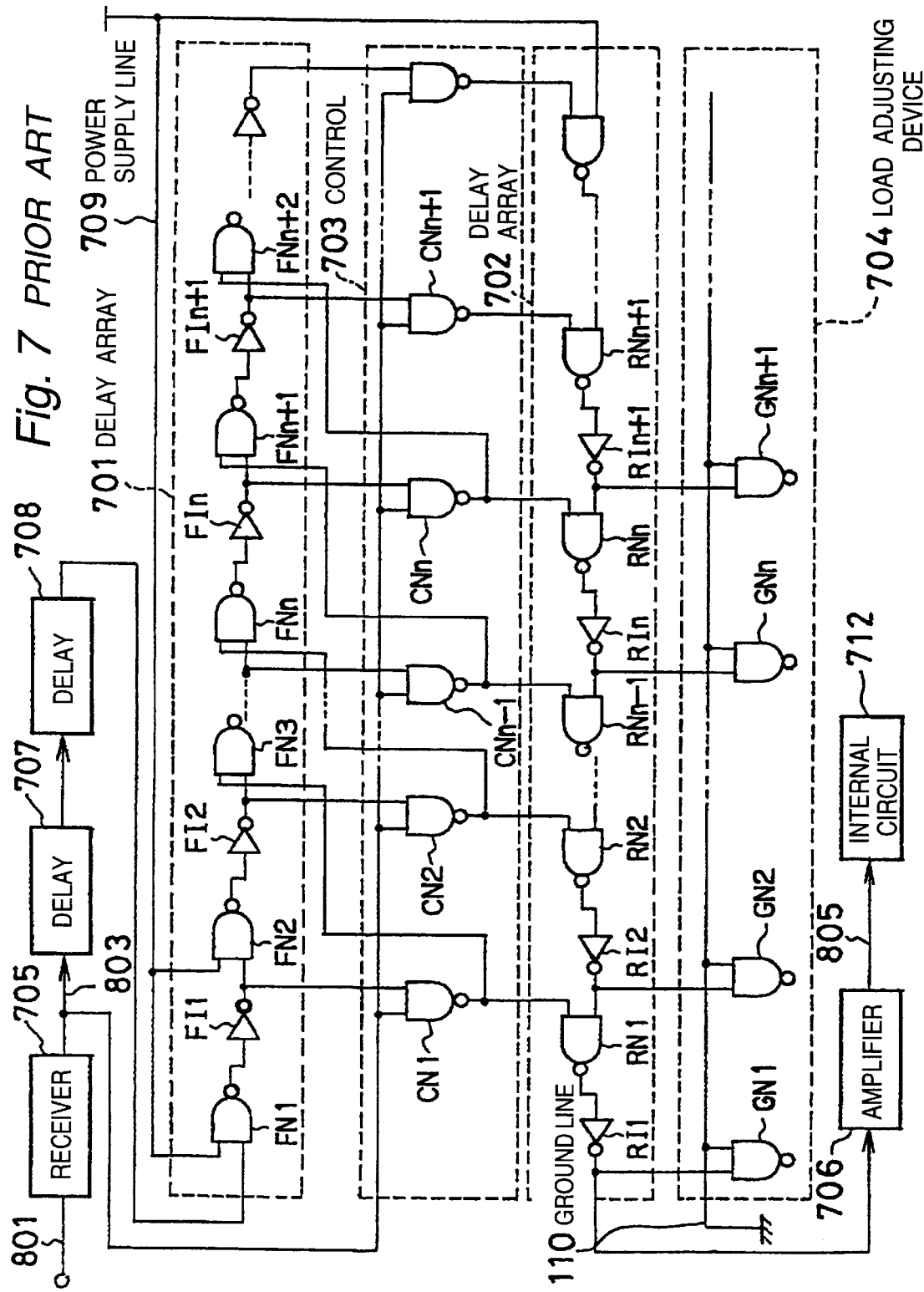
FIG. 7 is a circuit diagram illustrating a circuit construction of one example of the prior art delay circuit device.

FIG. 5 is a circuit diagram of another embodiment of the delay circuit device in accordance with the present invention. Referring to FIG. 5, this embodiment has a fundamental construction similar to that of the first embodiment shown in FIG. 1, but has such a construction that an output of five inverters in the delay circuit array 101 in the order near to the delay circuit 108 are supplied to discriminator circuits 111a, 111b, 111c, 111d and 111e, respectively, and it comprises a logic gate Ga for executing a logic AND operation between a logical inversion of an output of the discriminator circuit 111c and the output of the receiver circuit 105 so as to supply an output to a control circuit 103a, a logic gate Gb for executing a logic AND operation between a logical inversion of an output of the discriminator circuit 111d and the output of the receiver circuit 105 so as to supply an output to a control circuit 103b, a logic gate Gc for executing a logic AND operation between a logical inversion of an output of the discriminator circuit 111e, an output of the discriminator circuit 111a and the output of the receiver circuit 105 so as to supply an output to a control circuit 103c, a logic gate Gd for executing a logic AND operation between an output of the discriminator circuit 111b and the output of the receiver circuit 105 so as to supply an output to a control circuit 103d, and a logic gate Ge for executing a logic AND operation between the output of the discriminator circuit 111c and the output of the receiver circuit 105 so as to supply an output to a control circuit 103e.

In the first embodiment shown in FIG. 1, at such a frequency that after the (m)th clock reaches the inverter FIb1 but before the (m)th clock reaches the inverter FIc1, the (m+1)th clock is outputted from the receiver circuit 105, all of the clocks 203a, 203b and 203c operate. In this embodiment, however, the output of at least two of the five discriminator circuits 111a, 111b, 111c, 111d and 111e are fixed to the low level, so that the clock operating in synchronism with the input clock 201 is two or three of five clocks 203a, 203b, 203c, 203d and 203e, whatever frequency the clock is.

In the delay circuit array divided into a plurality of blocks, signals in synchronism with the clock 201 are supplied to the control circuits receiving the output of the blocks before and after the block through which the (m)th clock is traveling. The reason for this is that, even if the frequency of the signal slightly changes with the result that the final block to which the (m+1)th clock is propagated, changes to the block before or after the final block to which the (m+1)th clock had been propagated, the timing of the clock 205 is not influenced at all.

As mentioned above, according to the present invention, since a plurality of control circuits are provided in such a manner that the signal in synchronism with the clock 201 is in no way applied to the control circuit(s) having no possibility that the (m)th clock is traveling at the frequency being used, it is possible to reduce the load capacitance of the NAND gates in the control circuits driven with the signal in synchronism with the clock 201, and therefore, the current consumption can be advantageously reduced.

In addition, according to the present invention, even if the number of stages in the first delay circuit is increased because the clock period "tck" is long, if the dividing number of the control circuit is correspondingly increased, it is possible to minimize the load capacitance which is charged and discharged during each one cycle.

Furthermore, according to the present invention, if it is caused to operate when the semiconductor device is in a standby mode so as to minimize the current consumption, it is possible to quickly obtain a desired clock if necessary. Since the proportion of the current consumed by the delay circuit in the standby mode is large, the above advantage particularly becomes remarkable.

What is claimed is:

1. A delay circuit device comprising:
   a first delay circuit array so constructed that an output is taken from an arbitrary position of a first signal transmission path;
   a second delay circuit array so constructed that an input is applied to an arbitrary position of a second signal transmission path;
   at least two discriminating circuits receiving outputs from at least two positions, one position corresponding to each discriminating circuit, said two positions being along said first signal transmission path so as to divide said first delay circuit array into at least three parts; and
   at least three control circuits, each having a signal input terminal connected to said first delay circuit array, a signal output terminal connected to said second delay circuit array, and an input/output control terminal;
   wherein said first delay circuit array and said second delay circuit array are so arranged that the direction of said first and second signal transmission paths are opposite to each other,
   wherein an output of cascaded delay circuits in said first delay circuit array is connected to an input of cascaded delay circuits in said second delay circuit array through said control circuits in the order from the position near to an input of said first delay circuit array and in the order from the position near to an output of said second delay circuit array,
   wherein an input pulse signal is supplied to said first delay circuit array, and information as to whether or not a first signal of said input pulse signal is propagated to said outputs of said at least two positions which divide said first delay circuit array into said at least three parts, is respectively latched to said discriminating circuits receiving said outputs of said at least two positions,
   wherein when an arbitrary time has elapsed after said first signal of said input pulse signal is supplied, a second signal of said input pulse signal is selectively supplied to said control circuits, in accordance with information latched in said discriminating circuits, and said first signal on said first delay circuit array is transferred to said second delay circuit array, and said first signal on said first delay circuit array is removed from said first delay circuit array.

2. A delay circuit device claimed in claim 1 wherein said first delay circuit array is divided by (n−1) positions into "n" portions, where n≧3, and when one discriminating circuit of said discriminating circuits receiving an output of a (j)th position counted from the position near to the input of said first delay circuit array, where "j" is a natural number, for discriminating whether or not said first signal has not been propagated to said output of said, (j)th position, and upon discriminating that said first signal is not so propagated, said one discriminating circuit controls said control circuits so that said second signal is not supplied to at least a portion of said control circuits receiving the output of said first delay circuit array after a (j+2)th position.

3. A delay circuit device claimed in claim 1 wherein said first delay circuit array is divided by (n−1) positions into "n" portions, where n≧3, and when one discriminating circuit of said discriminating circuits receiving an output of a (k)th position counted from the position near to the input of said first delay circuit array, where "k" is a natural number, for discriminating whether or not said first signal has not been propagated to said output of said (k)th position, upon discriminating that said first signal is not so propagated, said one discriminating circuit controls said control circuits so that said second signal is not supplied to at least a portion of said control circuits receiving the output of said first delay circuit array after a (k−2)th position.

4. A delay circuit device claimed in claim 1 wherein said first delay circuit array is divided by (n−1) positions into "n" portions, where n≧3, and when a first discriminating circuit of said discriminating circuits receiving an output of a (j)th position counted from the position near to the input of said first delay circuit where "j" is a natural number, for discriminating whether or not said first signal has not been propagated to said output of said (j)th position, and upon discriminating that said first signal is not so propagated, said first discriminating circuit controls said control circuits so that said second signal is not supplied to at least a portion of said control circuits receiving the output of said first delay circuit array after a (j+2)th position, and when a second discriminating circuit of said discriminating circuits receiving an output of a (k)th position counted from the position near to the input of said first delay circuit array, where "k" is a natural number, for discriminating whether or not said first signal has been propagated to said output of said (k)th position, and upon discriminating that said first signal is not so propagated, said second discriminating circuit controls said control circuits so that said second signal is not supplied to at least another portion of said control circuits receiving the output of said first delay circuit array before a (k−2)th position.

5. A delay circuit device claimed in claim 1 wherein each of said discriminating circuits comprises a latch that is set when the output of said first delay circuit array has changed from a first level to a second level as the result of the propagation of said first signal, and is reset by said second signal.

6. A delay circuit device claimed in claim 2 wherein each of said discriminating circuits comprises a latch that is set when the output of said first delay circuit array has changed from a first level to a second level as the result of the propagation of said first signal, and is reset by said second signal.

7. A delay circuit device claimed in claim 3 wherein each of said discriminating circuits comprises a latch that is set when the output of said first delay circuit array has changed from a first level to a second level as the result of the propagation of said first signal, and is reset by said second signal.

8. A delay circuit device claimed in claim 4 wherein each of said discriminating circuits comprises a latch that is set when the output of said first delay circuit array has changed from a first level to a second level as the result of the propagation of said first signal, and is reset by said second signal.

* * * * *